(12) United States Patent
Chrappan Soldavini

(10) Patent No.: US 6,624,701 B2
(45) Date of Patent: Sep. 23, 2003

(54) CURRENT AMPLIFIER

(75) Inventor: Francesco Chrappan Soldavini, San Donato Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/945,320

(22) Filed: Aug. 31, 2001

(65) Prior Publication Data

US 2002/0027476 A1 Mar. 7, 2002

(30) Foreign Application Priority Data

Sep. 5, 2000 (IT) ..................... MI2000A1951

(51) Int. Cl.[7] ................................. H03F 3/45
(52) U.S. Cl. ....................... 330/288; 330/267
(58) Field of Search ................ 330/267, 268, 330/288, 264, 273, 277, 285; 327/112, 108; 323/315; 326/83, 85

(56) References Cited

U.S. PATENT DOCUMENTS 4,375,619 A * 3/1983 Saari ..................... 330/253
5,399,992 A * 3/1995 Itakura et al. ............ 330/253
6,297,672 B1 * 10/2001 Okayasu ................. 327/103

* cited by examiner

*Primary Examiner*—Timothy P. Callahan
*Assistant Examiner*—Linh Nguyen
(74) *Attorney, Agent, or Firm*—Lisa K. Jorgenson; Robert Iannucci; Seed IP Law Group PLLC

(57) ABSTRACT

A current amplifier includes an input branch having a first input; an output branch coupled to said input branch; a bias branch suitable for biasing said input branch. The input branch comprises at least one switch commanded by a first bias voltage supplied by said bias branch so as to substantially block the current flowing in said input branch and consequently substantially block the current flowing in said output branch when the current applied to said first input is null.

19 Claims, 3 Drawing Sheets

CURRENT AMPLIFIER

BACKGROUND OF THE INVENTION

1. Field of the Invention

The present invention refers to a current amplifier, and a drive circuit for controlled edge power elements comprising a current amplifier in accordance with the present invention.

2. Description of the Related Art

In the current, amplifiers normally used the consumption of current is constant irrespective of the current supplied at the load and equal to the maximum current foreseen.

We now refer to FIG. 1 which shows a current amplifier of the open-loop type according to the known art. It comprises a transistor M1 having the source connected to the supply voltage Vcc, the gate and the drain connected together and connected to a current generator Ibias in turn connected to ground. The gate of the transistor M1 is also connected to the gate of a transistor M2 and to the gate of a transistor M4. The transistor M2 has the source connected to the supply voltage Vcc and the drain connected to the input terminal In of the current amplifier. The drain of the transistor M2 is also connected to the drain and to the gate of a transistor M3, whose source is connected to ground. The transistor M4 has the source connected to the supply voltage Vcc and the drain connected to the output terminal Out of the current amplifier and to the drain of a transistor M5, whose source is connected to ground and whose gate is connected to the gate of the transistor M3.

In this circuit all the transistors operate and a variation of the current applied at the input In becomes amplified at the output Out.

We now refer to FIG. 2 which shows a current amplifier of the closed-loop type according to the known art. It comprises a transistor M5 having the source connected to the supply voltage Vcc, the drain connected to the drain and to the gate of a transistor M7 whose source is connected to ground. The gate of the transistor M5 is connected to the gate and to the drain of a transistor M1 whose source is connected to the supply voltage Vcc. The gate of the transistor M1 is connected to the drain of a transistor M3 whose source is connected to a current generator Ibias, in turn connected to ground, and whose gate is connected to the input In of the current amplifier. The source of the transistor M3 is also connected to the source of a transistor M4, whose gate is connected to the input Ref of the current amplifier and its drain is connected to the gate and to the drain of a transistor M2 whose source is connected to the supply voltage Vcc. The gate of the transistor M2 is also connected to the gate of a transistor M6 and to the gate of a transistor M9. The transistor M6 has the source connected to the supply voltage Vcc and the drain connected to the input terminal In of the current amplifier and to the drain of a transistor M8, whose source is connected to ground. The transistor M9 has the source connected to the supply voltage Vcc and the drain connected to the output terminal Out of the current amplifier and to the drain of a transistor M10, whose source is connected to ground. The transistor M10 has the gate connected to the gate of the transistor M8 and to the gate of the transistor M7.

Also in this circuit all the transistors operate and an unbalancing of the current applied to the input In is amplified at the output Out.

BRIEF SUMMARY OF THE INVENTION

An embodiment of the present invention provides a current amplifier that does not have the inconveniences of the known art and that it is of simple construction.

The current amplifier comprises an input branch having a first input; an output branch coupled to the input branch; and a bias branch suitable for biasing the input branch. The input branch comprises at least one switch commanded by a first bias voltage supplied by the bias branch so as to substantially block the current flowing in the input branch and consequently substantially block the current flowing in the output branch when the current applied to the first input is null.

Another embodiment of the invention is directed to a drive circuit for controlled edge power elements comprising: a first integrating circuit having a first input suitable for receiving in input a first drive signal; an integrating capacitor coupled to the integrating circuit; a first power element driven by the first integrating circuit and suitable for driving a load, the load having a first terminal; characterized in that the first integrating circuit includes a first current amplifier in accordance with claim 1 and that the integrating capacitor is coupled between the first input and a predetermined reference voltage.

The characteristics and advantages of the present invention will appear evident from the following detailed description of an embodiment thereof, illustrated as non-limiting example in the enclosed drawings, in which:

BRIEF DESCRIPTION OF THE SEVERAL VIEWS OF THE DRAWING(S)

DETAILED DESCRIPTION OF THE INVENTION

Figure 1:
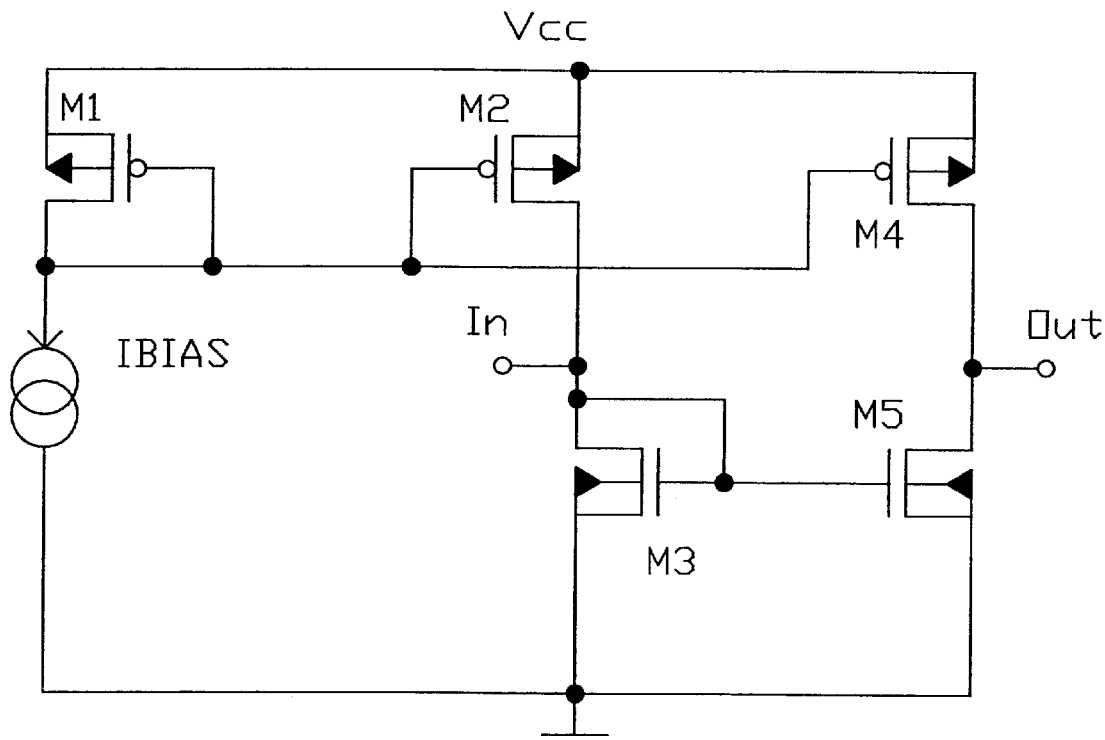
FIG. 1 represents a current amplifier of the open-loop type according to the known art.
Figure 2:
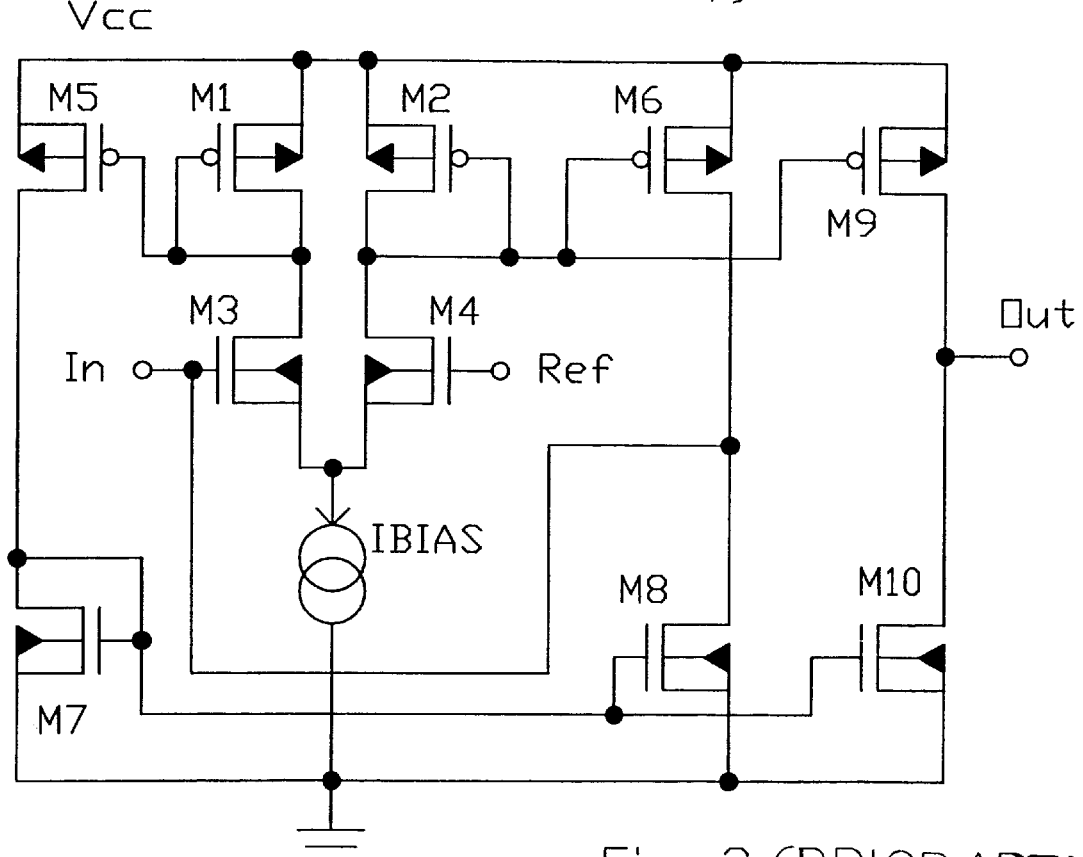
FIG. 2 represents a current amplifier of the closed-loop type according to the known art.
Figure 3:
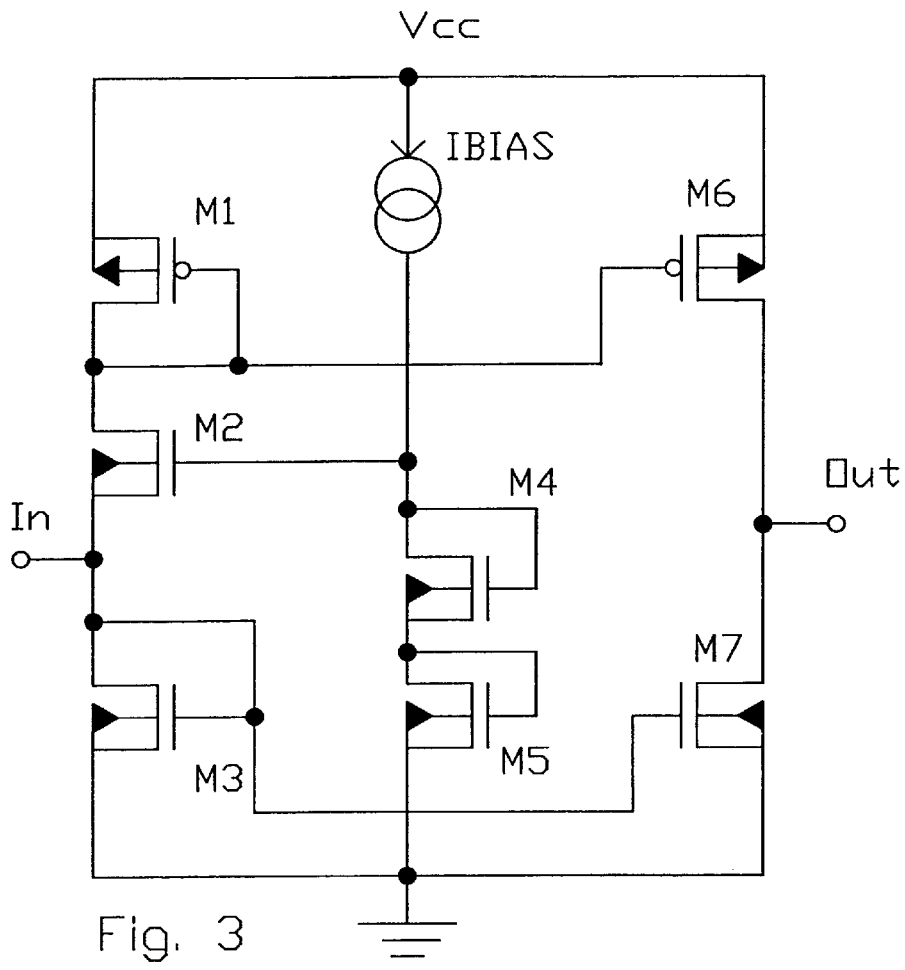
FIG. 3 represents a current amplifier of the open-loop type according to a first embodiment of the present invention.

We now refer to FIG. 3 which represents a current amplifier of the open-loop type in accordance with a first embodiment of the present invention. It comprises an input In which is connected to the drain of a diode-connected NMOS transistor M3 having its drain connected to its gate and its source connected to ground. The drain of the transistor M3 is connected to the source of an NMOS transistor M2 whose drain is connected to the drain of a diode-connected PMOS transistor M1 having its drain connected to its gate and its source connected to a voltage supply Vcc. The gate of the transistor M1 is connected to the gate of a PMOS transistor M6 whose source is connected to the supply voltage Vcc and its drain is connected to the output terminal Out of the amplifier. The gate of the transistor M3 is also connected to the gate of an NMOS transistor M7 whose drain is connected to the output terminal Out of the amplifier and its source is connected to ground. The gate of the transistor M2 is connected to the drain of a diode-connected NMOS transistor M4 having its drain connected to its gate and its source connected to the drain and to the gate of a diode-connected NMOS transistor M5 whose source is connected to ground. The gate of the transistor M2 is also connected to a current generator Ibias which in turn is connected to the supply voltage Vcc.

The transistors M4 and M5 and the current generator Ibias are sized so as to bias the gate of the transistor M2 at a slightly lower voltage than the sum of the threshold voltages of the transistors M2 and M3. It results possible to use only one transistor instead of two transistors M4 and M5 if suitable sized. If the current to the input is null, M3, M2 and M1 will be switched off and consequently also the transistors M6 and M7. In this condition the current absorbed by the supply is only the current Ibias, which can be made very small. This characteristic is particularly interesting in the applications of driving power stages, in which current at the stage is requested only by the output transistors, so as to reduce the average power absorbed by the system.

If the current at the input of the amplifier is positive, that is enters from the input In, the transistors M3 and M7 will turn on, while M2, M1 and M6 will remain off. Suitably choosing the relation among the dimensions between the transistors M7 and M3 it is possible to set the current gain of the amplifier in these conditions. If vice versa the current at the input In is in output (negative), the transistor M2 will turn on forcing M1 and M6 to turn on while the transistors M3 and M7 will remain off. Suitably choosing the relation among the dimensions between the transistors M6 and M1 it is possible to set the current gain of the amplifier in these conditions.

In accordance with the present invention with a current amplifier as described, a circuit simplicity accompanied by a reduced consumption of current at idle state and during operation, as either the upper stages (M1, M2 and M6) or the lower stages (M3, M7) operate alternatively and the possibility of having an asymmetrical gain are obtained. The transistors M1, M2 and M3 form the input branch, the transistors M4, M5 and the current generator Ibias form the bias branch and the transistors M6 and M7 form the output branch.

The transistor M2 behaves like a switch commanded by the bias voltage supplied by the bias branch so that it can activate only when the current is in output from the input In, and consequently activating the upper stages. The lower stages are activated directly by the incoming current from the input In.

A similar circuit can also be realized by inverting the supply voltage Vcc with ground and inverting the type of the transistors, that is we replace those of the type P with N-type transistors and vice versa. Thus we obtain a circuit suitable for being used for the drive of P-type power elements.

The current amplifier as above described functions in class B. It can also function in class AB, if the transistors M4 and M5 and the current generator Ibias are sized so as to bias the gate of the transistor M2 at a slightly higher voltage than the sum of the threshold voltages of the transistors M2 and M3, so that they are in a situation of light conduction, consequently also the transistors M6 and M7 will be in light conduction or in other words so as to substantially block the current flowing in said input branch and consequently substantially block the current flowing in said output branch when the current applied to said first input is null.

Figure 4:
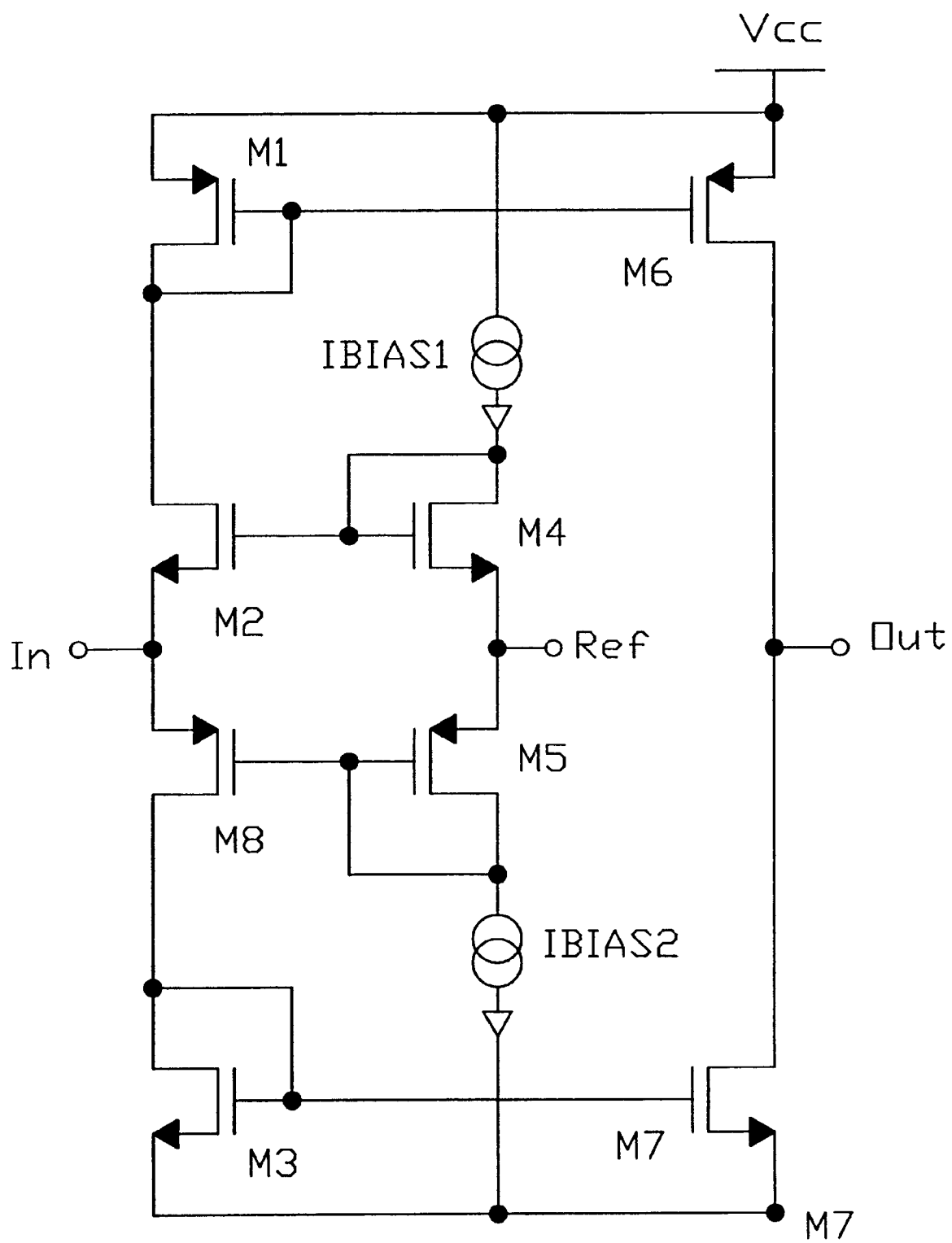
FIG. 4 represents a current amplifier of the open-loop type according to a second embodiment of the present invention.

We now refer to FIG. 4 which represents a current amplifier of the open-loop type in accordance with a second embodiment of the present invention. It comprises all the circuit elements shown in FIG. 3 that keep the same numerical references with some exceptions. It comprises in addition a PMOS transistor M8 connected between the input In and the transistor M3. In particular it has the source connected to the input In, the drain connected to the gate of the transistor M3 and the gate connected to the gate of the transistor M5 which in this case is an NMOS transistor. The gate and the drain of the transistor M5 is connected to a second current generator Ibias2 which in turn is connected to ground.

The transistors M4, M5 and the current generators Ibias and Ibias2 are sized so as to set the difference between the gate voltages of the transistors M2 and M8 at a slightly lower voltage than the sum of their threshold voltages.

If the current to the input In is null, M1, M2, M8, and M3 will be off and consequently also the transistors M6 and M7. In this condition the current absorbed by the supply is the only current Ibias equal to the current Ibias2, which can be made very small. This characteristic is particularly interesting in the applications of driving power stages, in which current at the stage is requested only by the output transistors, so as to reduce the average power absorbed by the system.

If the current to the input of the amplifier is in input from the input In, the transistor M8 will turn on forcing the transistors M3 and M7 to turn on, while M2, M1 and M6 will remain off. Suitably choosing the relation among the dimensions between the transistors M7 and M3 it is possible to set the current gain of the amplifier in these conditions. If vice versa the current is in output from the input In, the transistor M2 will turn on forcing M1 and M6 to turn on while the transistors M8, M3 and M7 will remain off. Suitably choosing the relation among the dimensions between the transistors M6 and M1 it is possible to set the current gain of the amplifier in these conditions.

In accordance with the present invention with a current amplifier as described, a circuit simplicity accompanied by a reduced consumption of current at idle state and during operation as either the upper stages (M1, M2 and M6) or the lower stages (M8, M3 and M7) operate alternatively and the possibility of having an asymmetrical gain are obtained.

The transistors M1, M2, M8 and M3 form the input branch, the transistors M4, M5 and the current generators Ibias and Ibias2 form the bias branch and the transistors M6 and M7 form the output branch.

The transistor M2 behaves, similar to FIG. 3, like a switch commanded by the bias voltage supplied by the bias branch so that it can activate only when the current is in output from the input In, and consequently activating the upper stages.

The transistor M8 also behaves like a switch commanded by the bias voltage supplied by the bias branch so that it can activate only when the current is incoming from input In, and consequently activating the lower stages.

The current amplifier as above described functions in class B. It can also function in class AB, if the transistors M4, M5 and the current generators Ibias and Ibias2 are sized so as to set the difference between the gate voltages of the transistors M2 and M8 to a slightly higher voltage than the sum of their threshold voltages, so that they are in a situation of light conduction, consequently also the transistors M6 and M7 being in light conduction, or in other words so as to substantially block the current flowing in said input branch and consequently substantially block the current flowing in said output branch when the current applied to said first input is null.

Figure 5:
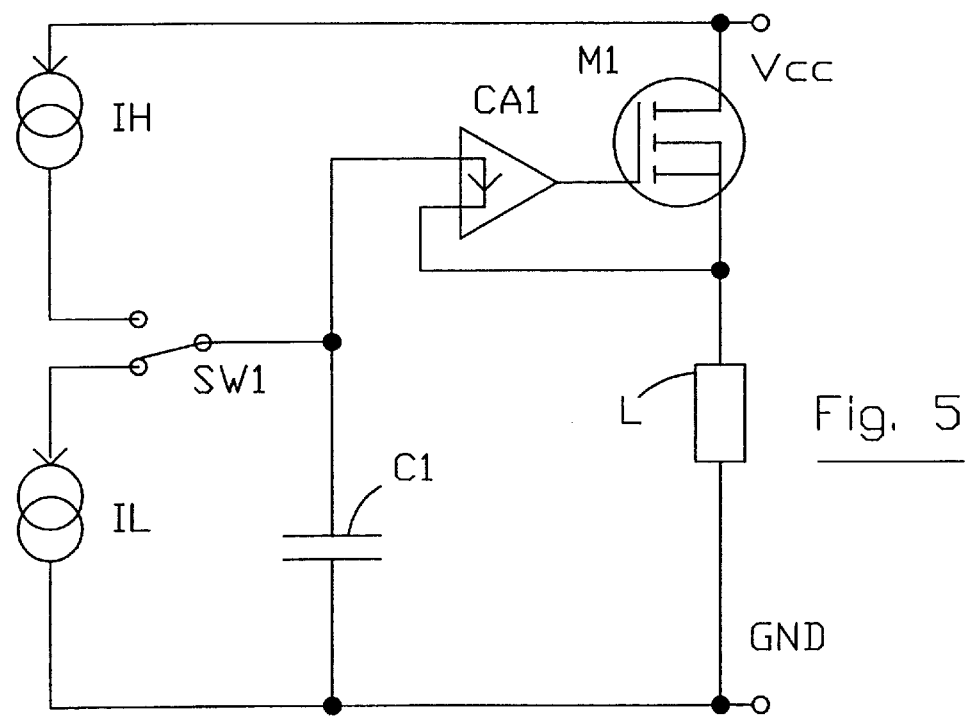
FIG. 5 represents a possible application of a current amplifier in accordance with the present invention.

We now refer to FIG. 5 which represents a possible application of a current amplifier in accordance with the present invention. In particular it refers to a drive circuit for controlled edge power elements of the high-side type in accordance with the present invention.

It comprises a first power element which in the figure is for example represented by a MOS transistor M1 having the drain connected to a voltage supply Vcc and the source connected to a terminal of a load L, which in turn is connected to ground Gnd. The gate of the transistor M1 is driven by a current amplifier CA1 which has the positive input to a terminal of a capacitor C1 and to a first terminal of a switch SW1. The negative input of the current amplifier CA1 is connected to the terminal of the load L. The other terminal of the capacitor C1 is connected to ground. The switch SW1 permits, upon command from a suitable circuit not shown in the figure, to commutate said first terminal between a second and a third terminal. The second terminal is connected to a current generator IH which in turn is connected to the supply voltage Vcc. The third terminal is connected to a current generator IL which in turn is connected to ground Gnd. The generator IH supplies a current to the capacitor C1, while the generator IL extracts a current from the capacitor C1.

The drive circuit thus comprises an integrating circuit constituted by the current amplifier CA1 and the capacitor C1, which adjusts the voltage on the load L and has a charge and discharge current determined by the current generators IH and IL which permits the slope of the leading and trailing edges applied to the load L to be controlled.

The path of the signal in the integrating circuit might not be evident but carries out the following path: CA1, M1, Vcc, Gnd, C1. In this case the transistor M1 acts as open drain.

The current generator CA1 is supplied in this case between the supply voltage Vcc and ground Gnd. But the current amplifier CA1 can be supplied by a voltage generator V1 between the voltage V1 and the reference voltage present on the source of the transistor M1. It therefore is possible to supply the current amplifier CA1 between the source of the transistor M1 and a suitable voltage supplied by a voltage regulator V1 with a voltage equal to the voltage of the source of the transistor M1 increased by a suitable value lower than the breaking stress of the gate oxide of the transistor M1, and consequently lower than the supply voltage Vcc. In this case the problem of having to introduce the voltage clipping circuits of the voltage applied to the gate of the transistor M1 is resolved, should the breaking stress of the gate oxide of the transistors MOS be lower than the supply voltage of the circuit.

Another advantage is being able to use low voltage components for the current amplifier and in particular CMOS components which are known to be less sensitive to problems of under-ground and over-voltage typical of the drive stages of inductive loads such as motors and solenoids.

As amplifier CA1 it is possible to use the amplifier shown in FIG. 4, or in the event that the amplifier is supplied between a voltage V1 and the voltage present on the source of M1 it is possible to use the amplifier shown in FIG. 3, where the reference input corresponds to its ground.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. Current amplifier comprising
  an input branch having a switch and a first input;
  an output branch coupled to said input branch;
  a bias branch coupled to the switch of the input branch, suitable for biasing said input branch, and structured to command the switch by supplying the switch with a first bias voltage so as to substantially block current flowing in said input branch and consequently substantially block current flowing in said output branch when a current applied to said first input is null, wherein said input branch includes a first transistor, said output branch includes a second transistor, and said switch is a MOS transistor having a source connected to said first input, a drain connected to said first and second transistors, and a gate biased by said first bias voltage so as to substantially block current from flowing through the MOS transistor when the current applied to said first input is null and therefore substantially block the conduction of the first and second transistors.

2. Current amplifier in accordance with claim 1 wherein the switch is a first switch and the input branch also includes a second switch commanded by a second bias voltage supplied by said bias branch.

3. Current amplifier in accordance with claim 2 wherein said input branch includes a third transistor, said output branch includes a fourth transistor, and said second switch is a MOS transistor having a source connected to said first input, a drain connected to said third and fourth transistors, and a gate biased by said second bias voltage so as to substantially block the current flowing to its inside when the current applied to said first input is null and therefore substantially block the conduction of the third and fourth transistors.

4. Current amplifier in accordance with claim 2 wherein said bias branch comprises a first current generator having a first terminal connected to a first supply voltage and a second terminal coupled to two diodes placed in series and connected to a terminal of a second current generator in turn connected to a second supply voltage, said second terminal of said first current generator producing said first bias voltage, and said terminal of said second current generator producing said second bias voltage.

5. Current amplifier in accordance with claim 1 wherein said bias branch comprises a first current generator having a terminal connected to a first supply voltage and a terminal coupled to a diode in turn connected to a second supply voltage, said terminal coupled to said diode supplying said first bias voltage.

6. A current amplifier, comprising:
  a first current generator having first and second terminals, the first terminal being coupled to a first voltage reference;
  a first input switch coupled between the first voltage reference and an input node and having a control terminal;
  a first output switch coupled between the first voltage reference and an output node and having a control terminal electrically connected to the control terminal of the first input switch; and
  a first control switch having first and second conduction terminals electrically coupled to the input node and to the control terminals of the input and output switches, respectively, the first control switch having a control terminal electrically coupled to the second terminal of the first current generator so as to be driven by a bias voltage at the second terminal of the first current generator.

7. The current amplifier of claim 6, further comprising a first diode coupled between the second terminal of the first current generator and a second voltage reference.

8. The current generator of claim 7, further comprising a second diode coupled between the first diode and the second voltage reference.

9. A current amplifier, comprising:
  a first current generator having first and second terminals, the first terminal being coupled to a first voltage reference;

a first input switch coupled between the first voltage reference and an input node and having a control terminal;

a first output switch coupled between the first voltage reference and an output node and having a control terminal;

a first control switch coupled to the input node and to the control terminals of the input and output switches, the first control switch having a control terminal coupled to the second terminal of the first current generator;

a first diode coupled between the second terminal of the first current generator and a second voltage reference;

a second diode coupled between the second voltage reference and a third voltage reference; and a second current generator coupled between the second diode and the third voltage reference.

10. The current amplifier of claim 6, further comprising a diode coupled between the input node and a second voltage reference.

11. The current amplifier of claim 6, further comprising a second input switch coupled between the input node and a second voltage reference; and a second output switch coupled between the output node and the second voltage reference, the second output switch having a control terminal coupled to a control terminal of the second input switch.

12. The current amplifier of claim 6, further comprising:

a second current generator having first and second terminals, the first terminal being coupled to a second voltage reference;

a second input switch coupled between the second voltage reference and the input node and having a control terminal;

a second output switch coupled between the second voltage reference and the output node and having a control terminal; and a second control switch coupled to the input node and to the control terminals of the second input and second output switches, the second control switch having a control terminal coupled to the second terminal of the second current generator.

13. A current amplifier, comprising:

a first current generator having first and second terminals, the first terminal being coupled to a first voltage reference;

a first input switch coupled between the first voltage reference and an input node and having a control terminal;

a first output switch coupled between the first voltage reference and an output node and having a control terminal;

a first control switch coupled to the input node and to the control terminals of the input and output switches, the first control switch having a control terminal coupled to the second terminal of the first current generator; and a bias transistor coupled between the first current generator and a third voltage reference, the bias transistor having a control terminal coupled to the control terminal of the first control switch.

14. A current amplifier comprising an input branch having a first input, an upper stage, and a lower stage;

an output branch having an upper stage and a lower stage coupled respectively to the upper and lower stages of the input branch;

biasing means for biasing the input branch so as to substantially block current flowing in the input branch and consequently substantially block current flowing in the output branch when a current applied to the first input is null; and activate the input and output upper stages when the current applied to the first input is negative, wherein the bias branch comprises a first current generator having a terminal connected to a first supply voltage and a terminal coupled to a diode in turn connected to a second supply voltage, the terminal coupled to the diode supplying a first bias voltage for biasing the input branch.

15. The current amplifier of claim 14 wherein the biasing means also biases the input branch so as to activate the input and output lower stages when the current applied to the first input is positive.

16. The current amplifier of claim 14 wherein the input branch includes a first transistor, the output branch includes a second transistor, and the input branch also includes a MOS transistor having a source connected to the first input, a drain connected to the first and second transistors, and a gate biased by a first bias voltage so as to substantially block current from flowing through the MOS transistor when the current applied to the first input is null and therefore substantially block the conduction of the first and second transistors.

17. The current amplifier of claim 14 wherein the input branch includes a first switch commanded by the first bias voltage and the input branch also includes a second switch commanded by a second bias voltage supplied by the biasing means.

18. The current amplifier of claim 17 wherein the input branch includes a first transistor, the output branch includes a second transistor, and the second switch is a MOS transistor having a source connected to the first input, a drain connected to the first and second transistors, and a gate biased by the second bias voltage so as to substantially block the current flowing to its inside when the current applied to the first input is null and therefore substantially block the conduction of the first and second transistors.

19. The current amplifier of claim 17 wherein the diode is one of two diodes placed in series and connected to a terminal of a second current generator in turn connected to the second supply voltage, the terminal of the second current generator producing the second bias voltage.

* * * * *